(12) United States Patent
Drury

(10) Patent No.: US 6,802,877 B2
(45) Date of Patent: Oct. 12, 2004

(54) POLYVINYL ACETAL COMPOSITION ROLLER BRUSH WITH ABRASIVE OUTER SURFACE

(76) Inventor: Thomas J. Drury, 28 Lisa La., Tolland, CT (US) 06084

( * ) Notice: Subject to any disclaimer, the term of this patent is extended or adjusted under 35 U.S.C. 154(b) by 274 days.

(21) Appl. No.: 09/973,804

(22) Filed: Oct. 11, 2001

(65) Prior Publication Data

US 2002/0173259 A1 Nov. 21, 2002

Related U.S. Application Data

(63) Continuation-in-part of application No. 09/838,138, filed on Apr. 20, 2001.

(51) Int. Cl.$^7$ .......................... B24D 3/00; B24D 17/00; B24D 18/00; B08B 1/04
(52) U.S. Cl. ........................ 51/298; 51/295; 51/307; 51/308; 51/309; 428/315.5; 428/315.7; 428/318.8
(58) Field of Search ................. 51/295, 298, 307, 51/308, 309; 428/315.5, 315.7, 318.8; 15/244.1, 244.4, 230

(56) References Cited

U.S. PATENT DOCUMENTS

| 4,098,728 A | | 7/1978 | Rosenblatt | |
|---|---|---|---|---|
| 4,106,915 A | * | 8/1978 | Kagawa et al. | ................ 51/296 |
| 4,566,911 A | | 1/1986 | Tomita et al. | |
| RE35,709 E | | 1/1998 | Culler | |
| 6,076,662 A | * | 6/2000 | Bahten | ....................... 206/207 |
| 6,080,092 A | | 6/2000 | Cercone et al. | |
| 6,395,382 B1 | * | 5/2002 | Nagasaka et al. | ........ 428/318.6 |

* cited by examiner

Primary Examiner—Michael Marcheschi

(57) ABSTRACT

A semiconductor polishing device having a substantially cylindrical roller body made of polyvinyl acetal with a uniform material porosity having a mean flow pore pressure ranging from about 0.30 PSI to about 0.35 PSI with 80% of its pores ranging from 7 to 40 microns in size coated with a low viscosity adhesive composition of an appropriately formulated aliphatic or aromatic difunctional polyether urethane methacrylate or formulated multifunctional allphatic urethane acrylate and abrasive particles to form an adhesive skin of about 1 micron in thickness. The abrasive particles typically have a particle size ranging from about 0.05 to about 7 microns and a Mohs' hardness of at least about 7.

29 Claims, 1 Drawing Sheet

POLYVINYL ACETAL COMPOSITION ROLLER BRUSH WITH ABRASIVE OUTER SURFACE

RELATED APPLICATION

The present invention is a continuation-in-part application of U.S. patent application Ser. No. 09/838,138, filed Apr. 20, 2001.

FIELD OF THE INVENTION

The present invention relates generally to polishing devices for semiconductor wafers and more specifically relates to a roller constructed of a novel polyvinyl acetal composition with an abrasive outer skin surface containing metal or other abrasive particles allowing water or chemical flow through the roller body without clogging of the sponge pores thus precluding sponge material destruction while simultaneously providing an abrasive cleaning surface.

BACKGROUND OF THE INVENTION

Many industries today require the ability to efficiently clean highly finished surfaces, removing particles and other surface contaminants. Specific articles having highly finished surfaces include, but are not limited to, wafers of semiconductor material, and memory disks.

In the manufacturing process of integrated circuits or semiconductor wafers the wafers are initially polished to planarize the surface prior to subsequent processing of depositing the desired circuits. A combination of chemical and mechanical polishing is generally used which presently requires the introduction of polishing chemicals onto the surface of the semiconductor wafer as it is being polished or cleaned by the roller or brush. The chemicals may contain fine abrasive particles such as silica ($SiO_2$) and alumina ($Al_2O_3$). When the polishing is completed the semiconductor wafers must be cleaned to completely remove residual materials in order that the surface be made ready for subsequent photolithographic processing and other manufacturing steps.

Currently used cleaning brushes or rollers have their pores clogged with chemicals and abrasives and waste reducing flow and rapidly break down during the polishing process.

Devices for cleaning semiconductor wafers generally consist of a cylindrical roller or rollers passing over a wafer or polishing pads. The cylindrical roller conventionally includes tufted nylon or other types of bristles extending from a central core. The bristle roller brushes are fixed horizontally and rotate as the wafer or memory disk is passed between the bristle surfaced brushes while the surfaces receive large quantities of polishing solution and/or de-ionized water.

Wafers polished in this manner are often unacceptable due to uneven application of the bristles to the wafer surface. In addition, the softness of the bristles varies according to their composition, resulting in a heterogeneous mixture of bristles, each harder or softer than their counter parts. This results in breakage of the wafers as well as damage to wafer surfaces. Other drawbacks, resulting in unsatisfactory polishing, may be attributed to the hydrophobic nature of bristle tufted brushes. The fiber surfaces of these brushes are never wetted, and require large amounts of de-ionized water or polishing solution to work in the polishing process. Polishing devices using sponge material are generally more effective in polishing a surface but break down because of pore clogging and surface ripping. It has not been effective to clean such sponge brushes and they are generally discarded after an undesirable amount of residual polishing composition has been built up in the pores of the sponge. Since such sponge brushes are relatively costly, the sponge brushes are sometimes utilized beyond the point where they should be replaced resulting in inconsistent polishing of the wafers lowering the yield of semiconductor product wafers.

DESCRIPTION OF THE RELATED ART

U.S. Pat. No. 4,098,728, discloses a polyvinyl acetal sponge and a method for making the same. In this method, pore spaces in the sponge are formed by gas bubbles; rather than pore forming chemical additives such as starch/sulfate combinations. Because the sponge disclosed in this patent does not have any starch residue, it has been particularly useful in medical applications in which starch residues can cause a foreign body reaction when in contact with human tissue.

The use of synthetic sponges, made of polyvinyl acetal for cleaning devices is well known. For example, U.S. Pat. No. 4,566,911 discloses a roller scrubbing device using a polyvinyl acetal material for cleaning semiconductor chips having a surface layer of elastic polyvinyl acetal material with an average pore diameter ranging from 10 to 200 microns. U.S. Pat. No. 6,080,092 discloses an industrial sponge roller device with a cylindrical body of polyvinyl acetal material and a plurality of projections of a truncated conical shape extending from an outer surface of the cylindrical body.

U.S. Pat. No. RE 35,709 discloses using a low viscosity slurry comprising a polymerizable resin, abrasive particles and modifying particles to reduce the viscosity of the slurry for application to an article.

Conventional synthetic sponges have a polymer structure with "dead end pockets" formed therein that trap residue and trace amounts of metals and have non-uniform pore sizes causing fluid backup and residue deposit. As the sponge wears, these metals can come out of the sponge in the form of particulate matter. Such particulate matter can damage the surfaces that are to be cleaned. Further, this type of sponge has tiny fibrils in the pores thereof that are a result of spaces between the pore forming chemical additive during a cross-linking reaction. "Cross-linking" is the formation of ester bonding between chains of the two adjacent hydroxyl groups that occur with the reaction of polyvinyl alcohol and aldehyde. This reaction hardens and strengthens the resulting material.

Semiconductor wafers must be polished prior to any processing steps used to produce semiconductor devices. Due to the fragile nature of semiconductor wafers, achieving a high degree of polish, as well as a high yield of wafers is difficult. Many polishing devices produce a low yield of polished wafers due to breakage or an unacceptable level of surface contaminants. Memory discs provide less of a problem with breakage, being more durable.

It would be highly advantageous, therefore, to remedy the foregoing and other deficiencies inherent in the prior art.

SUMMARY OF THE INVENTION

A polishing roller of polyvinyl acetal having a uniform small pore size throughout the material in which over 80% of the pores of the material range from 7–40 microns in diameter with a mean flow pore diameter of about 20 microns and a mean flow pore pressure of 0.334 PSI. An abrasive such as $SiO_2$, $Al_2O_3$ and the like is applied to the outer surface of roller using a low viscosity slurry as the matrix and absorbed by the pores of the foam to provide an abrasive thin skinned polishing surface.

Accordingly, it is an object of the present invention to provide a new and improved polyvinyl acetal sponge material for use in polishing semiconductor wafers which has greater durability than prior sponge material.

Another object of the present invention is to provide an improved even flow rate of water and chemicals from the center of the core of the roller to the outside abrasive skin of the sponge material for even application of same to the surfaces of the articles being polished without clogging and tearing of the roller surface.

It is another object of the invention to provide a material which allows better polishing of surface materials using no or reduced cleaning solution and uniform solvent delivery at low rates.

It is still another object of the present invention to provide an improved sponge material for polishing semiconductors that has better polishing and strength characteristics.

It is yet another object of the present invention to provide a sponge material capable polishing semiconductor surfaces and adding to the life usage of the sponge material used in polishing the semiconductor wafers as well as reducing the use of polishing abrasives and cleaning materials currently used in prior art roller devices.

The present invention solves the above noted problems with polishing sponges in a manner not disclosed in the known prior art.

In the accompanying drawings, there is shown an illustrative embodiment of the invention from which these and other objectives, novel features and advantages will be readily apparent.

DETAILED DESCRIPTION OF THE PREFERRED EMBODIMENTS

Figure 1:
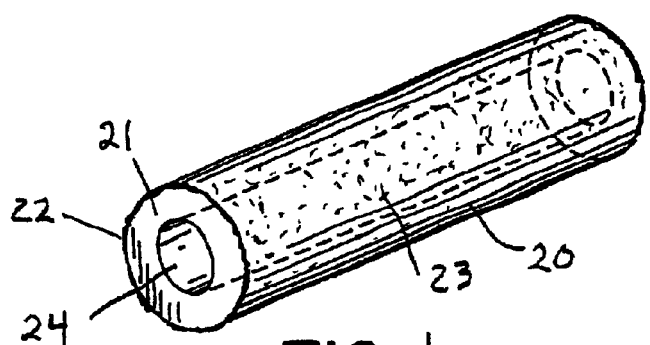
FIG. 1 is a perspective view of a roller polishing device made from the inventive sponge composition.
Figure 2:
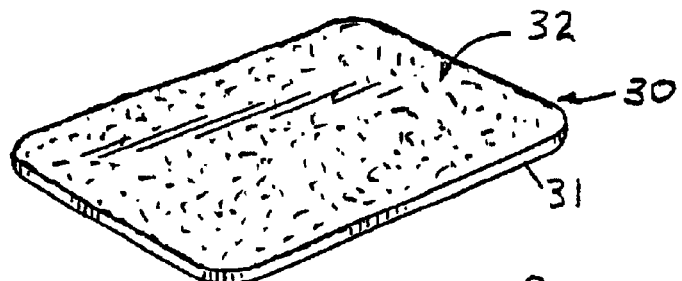
FIG. 2 is a perspective view of a polishing pad embodiment made from the inventive sponge composition.
Figure 3:
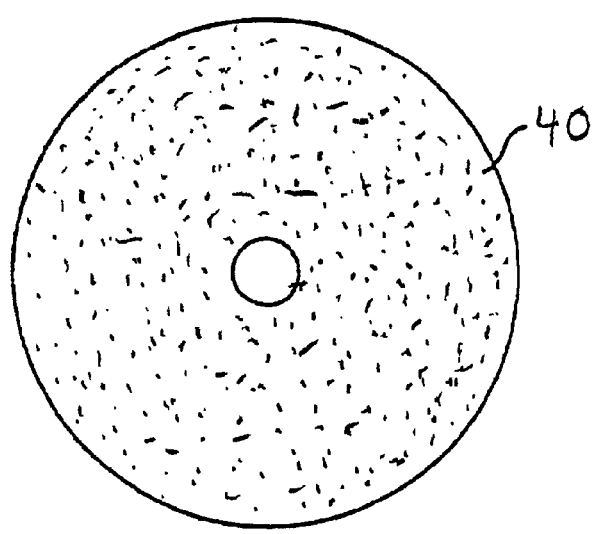
FIG. 3 is a top plan view of a polishing disk embodiment made from the inventive sponge composition.
Figure 4:
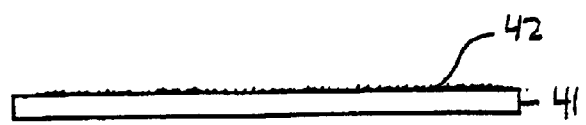
FIG. 4 is a side elevational view of the polishing disk embodiment shown in FIG. 3.

The best mode and the preferred embodiment of the novel semiconductor polishing device of the present invention is shown generally in FIG. 1.

FIG. 1 is a perspective view of a roller device 20 according to an embodiment of the present invention. This figure is merely an illustration and should not limit the scope of the claims herein. One of ordinary skill in the art would recognize other variations, modifications, and alternatives. The polishing device can range in size and shape, depending upon the application. According to the preferred embodiment, the polishing device is shaped as a cylindrical roller 20 with a body 21 which has an abrasive outer skin surface 22 with exposed abrasive particles 23 cured to the body 21. The body 21 has a central hollow core 24. The roller body 21 has homogeneous small pore distribution which absorbs the low viscosity adhesive and abrasive slurry forming skin 22. The roller body or core 21 is constructed by a shaped mold of polyvinyl acetal material and has an outer diameter of 60 mm and an inner diameter of 30 mm with a thickness of about 15 mm and has a length ranging from 6 inches to 18 inches and is able to hold tight specifications. The material has a consistent durometer ranging from between 5–9 depending on the wetness of the material and has a uniform small pore size which provides a flow through rate which does not put pressure on the roller or distort it during the polishing process. This allows even flow of chemicals from the center of the core to the outside of the diameter without sacrificing strength. It is thus easier to pass water or chemistry through the roller. Average flow requirements are reduced to 500–700 ml/minute from 120–180 ml/minute. The material has a higher rate for a better draw of debris, residue and chemistry from patterned wafer surfaces resulting in a cleaner and dryer end product. The foam rollers 20 can have shapes and sizes to meet the particular cleaning application for devices such as semiconductor wafers, hard disks, and other applications.

The porosity of the material of the roller body 21 is uniform with at least 80% and preferably about 90+% of the pore sizes being below 40 microns with the average pore diameter size or opening being about 20 microns. The pore size diameter opening ranges from about 7 microns to about 40 microns. Thus, the material has good flow properties, thus making the performance of the polishing roller 20, polishing pad 30 and polishing disc 40 highly satisfactory.

The roller body 21 core material has a pore size ranging from the smallest detected pore diameter of 7.1912 microns with a smallest detected pore pressure of 0.923 PSI . The cleaning roller material has a mean flow pore diameter of 20.0 microns with a mean flow pore pressure of 0.334 PSI. The material has a bubble point pressure of 0.026 PSI and maximum pore size distribution of 5.1417 and a diameter at maximum pore size distribution of about 14.34 microns. In measuring the flow rate through the material, at least 80% and preferably 90% of the pores have a diameter size 7 microns through 40 microns.

The method used to determine the aforenoted measurements for the material was a standard capillary flow analysis.

In a specific embodiment, the devices are made using a suitable material that is firm, porous, elastic, and has the characteristics noted above. The primary raw starting material for the device is air blown polyvinyl alcohol which is used to form a polyvinyl acetal porous elastic material with a uniform cell structure which forms the composition for the core 21. The porous material varies in characteristic depending upon cleanliness, type of pore forming agent or process, type of aldehyde employed for the conversion of a polyvinyl alcohol to a polyvinyl acetal, and other factors. These factors also include the relative proportions of reactants, reaction temperature and time, and the general condition and starting materials in the manufacturing process.

In manufacture, the base polyvinyl acetal material is heated and solubilized at about 190 degrees Fahrenheit, mixed with cross linking agent and catalyzed and placed into cast tubes or molds having the specific shape which is desired and slowly cured for 2 hours to 4 hours. After removing the molded polyvinyl acetal material from the cast, the shaped material is washed with a di-water carrier several times to remove the forming formaldehyde so that the formaldehyde is undetectable (under ½ part per million) by high pressure liquid chromatography but believed to be less than 0.1 part per million.

After formation of the core component of the device into the desired shape, roller 20, pad 30, or disc 40 and an abrasive skin 22, 32, 42 is formed on the respective body 21, 31, 41 by curing an adhesive, abrasive slurry on the shaped foam core of the device.

The abrasive slurry comprises low viscosity hydrophilic urethane adhesive which reacts to (is cured by) UV, abrasive particles, and may optionally contain other ingredients such as fillers, plasticizers, suspending agents, and surface modification additives. Preferably the adhesive is an appropriately formulated allphatic or aromatic difunctional polyether urethane methacrylate or formulated multifunctional allphatic urethane acrylate. The abrasive particles typically have a particle size ranging from 0.10 to about 100.0 microns and preferably about 0.05 to about 7 microns. It is preferred that the abrasive particles have a Mohs' hardness of at least about 7, more preferably at least about 8. Examples of abrasive particles include aluminum oxide, heat treated aluminum oxide, white fused aluminum oxide, black silicon carbide, green silicon carbide, silicon nitride, titanium diboride, boron carbide, tungsten carbide, titanium carbide, tantalum carbide, diamond, silica, silicon dioxide, iron oxides, chromia, ceria, cerium oxide, manganese dioxide, zirconia, titania, silicates, tin oxide, cubic boron nitride, garnet, alumina zirconia, zirconium oxide, sol gel abrasive particles, and combinations thereof.

The preferred abrasive particles used in the invention are aluminum oxide $Al_2O_3$ and silicon dioxide $SiO_2$ having a size ranging from 0.10 to about 100 microns, preferably 0.5 to 7 microns and most preferably about 1.2 microns.

The abrasive slurry is prepared by combining these materials together with either low shear and high shear mixing, with high shear mixing being preferred in a light free container. Ultrasonic mixing may also be utilized in combination with the mixing step to lower the viscosity of the abrasive slurry. It is preferred that the abrasive slurry be a homogeneous mixture of abrasive particles, urethane polymer, and optional additives. The weight of abrasive particles to resin range from 20% to 80% and more preferably from about 30% to 50%. It is important that the abrasive slurry be monitored before coating to ensure that the abrasive particles and other additives do not settle before coating. It may be preferred to continuously mix the abrasive slurry prior to coating to minimize separation of the abrasive particles, fillers, and/or reactive polymer. However the slurry coating is applied immediately after being mixed in a light free tunnel by dipping, a nip roll a doctor blade or any standard type of coating apparatus.

The layer of the coating is less than 0.2 mm, preferably about 0.1 mm and some abrasive is absorbed into the sponge pores and follows the contour of the pores so that the abrasive skin layer is less than 1 micron. The skin is then cured to the core piece by subjecting the same to UV light for 1–5 minutes, preferably 1 minute, at 300 watts.

In an alternative embodiment, after production of the core component, abrasive material 23 as previously noted in particle form ranging from 0.10 to about 100 microns or preferably 0.5 to 7.0 microns in size is mixed into a PVA resin having a composition similar to the core component 12 and water slurry. The abrasive/PVA mixture is stirred and baked at 190° F. for 1 to 2 hours until cured producing a composite metal/PVA polymer. The composite polymer is ground into a desired particle size, ranging from 10 to 200 microns preferably 30 to 50 microns, of metal and PVA crystals and placed on a coating bed.

The low viscosity PVA formal slurry is mixed as an adhesive and applied to the core. It is important that the adhesive has a low viscosity for several reasons. First, if the slurry is too thick, it will encapsule the metal/PVA crystals thus reducing its effectiveness. Secondly, if the slurry is too thick, it will not be absorbed into the body of the sponge core creating a hard surface in the sponge. The cured foam core 21, 31, 41 is dipped or coated with the low viscosity slurry and then immediately placed or rolled over the dried metal/PVA crystals or has the crystals applied by a doctor blade or other standard application device until the core surface is coated from 1 micron to about 1.0 millimeters with the metal/PVA crystals. The low viscosity slurry acts as an adhesive by picking up the metal/PVA crystals on the foam with the water portion of the slurry being sucked into the body of core leaving a slight tacky skin to which the metal/PVA crystals are bound. The covered coated product is then cured in an oven between 80° F. to 190° F. for 6 to 24 hours.

The principles, preferred embodiments and modes of operation of the present invention have been described in the foregoing specification. However, the invention should not be construed as limited to the particular embodiments which have been described above. Instead, the embodiments described here should be regarded as illustrative rather than restrictive. Variations and changes may be made by others without departing from the scope of the present invention as defined by the following claims:

What I claim is:

1. A polishing device comprising a body made of porous polyvinyl acetal material having a uniform pore size throughout the body with over 80% of the pores being below 40 microns in diameter, said body being coated with a slurry comprising a hydrophillic urethane based adhesive and mixed abrasive particles of polishing materials which are cured on said body to form a thin abrasive skin which is absorbed into the body pores and follows the contour of the pores and an outer surface of said body.

2. A polishing device as claimed in claim 1 wherein said abrasive particles are selected from the group consisting of $Al_2O_3$ and $SiO_2$ ranging in size from 0.1 microns to about 100.0 microns.

3. A polishing device as claimed in claim 1 wherein said abrasive particles are selected from the group consisting of $Al_2O_3$ and $SiO_2$ ranging in size 0.5 microns to about 7.0 microns.

4. A polishing device as claimed in claim 1 wherein said abrasive particles are selected from the group consisting of aluminum oxide, heat treated aluminum oxide, white fused aluminum oxide, black silicon carbide, green silicon carbide, silicon nitride, titanium diboride; boron carbide, tungsten carbide, titanium carbide, tantalum carbide, diamond, silica, silicon dioxide, iron oxide, chromia, coda, cerium oxide, manganese dioxide, zirconia, titania, silicates, tin oxide, cubic boron nitride, garnet, alumina zirconia, zirconium oxide, sol gel abrasive particles, and combinations thereof.

5. A polishing device as claimed in claim 1 wherein said polyvinyl acetal material has an average pore size of about 20 microns.

6. A polishing device as claimed in claim 1 wherein the weight of the adhesive particles is preferably less than 5% of the wight of said slurry.

7. A polishing device as claimed in claim 1 wherein said polishing device is a pad.

8. A polishing device as claimed in claim 1 wherein said polishing device is a roller.

9. A polishing device as claimed in claim 1 wherein said polishing device is a disk.

10. A polishing device as claimed in claim 1 wherein said cured skin is less than 1 millimeter in thickness.

11. A polishing device as claimed in claim 1 wherein the weight of the abrasive particles range from 5% to 80% of the weight of said slurry.

12. A semiconductor polishing device comprising a core body made of porous polyvinyl acetal material having a cylindrical roller shape and a outer surface, said material having a uniform pore size throughout with at least 80% of the pores ranging from about 7 microns to about 40 microns in diameter, a slurry of adhesive hydrophilic polymer and abrasive particles ranging from 0.5 to about 100.0 microns and comprising from 5% to 80% of the slurry by weight, said slurry being coated and cured on said outer surface of said cylindrical roller forming an abrasive skin.

13. A semiconductor polishing device as claimed in claim 12 wherein said abrasive particles are selected from the group consisting of aluminum oxide, beat treated aluminum oxide, white fused aluminum oxide, black silicon carbide, green silicon carbide, silicon nitride, titanium diboride, boron carbide, tungsten carbide, titanium carbide, tantalum carbide, diamond, silica, silicon dioxide, iron oxide, chromia, ceria, cerium oxide, manganese dioxide, zirconia, titania, silicates, tin oxide, cubic boron nitride, garnet, alumina zirconia, zirconium oxide, sol gel abrasive particles, and combinations thereof.

14. A semiconductor polishing device as claimed in claim 12 wherein said adhesive is selected from the group consisting of aliphatic polyether urethane methacrylate, aromatic difunctional polyether urethane methacrylate and aliphatic urethane acrylate.

15. A semiconductor polishing device as claimed in claim 12 wherein said abrasive skin comprises composite particles having a size of about 1.2 microns.

16. A semiconductor polishing device as claimed in claim 12 wherein said abrasive skin is about 1.0 microns in thickness.

17. A semiconductor polishing device comprising a substantially cylindrical roller body made of polyvinyl acetal having uniform porosity with 80% of its pores ranging from 7 to 40 microns and an abrasive particle and urethane adhesive composite skin cured to said body, said urethane adhesive being selected from the group consisting of aliphatic polyether urthane methacrylate, aromatic difunctional polyether urethane methacrylate and aliphatic urethane acrylate, said skin ranging in thickness from 0.5 to 7.0 microns.

18. A semiconductor polishing device comprising a body made of porous polyvinyl acetal material having a cylindrical roller shape and a outer surface, said material having a uniform pore size throughout with at least 80% of the pores ranging from about 7 microns to about 40 microns in diameter with a fluid flow through rate which does not distort the roller during the polishing process, a slurry comprising an adhesive of polyvinyl acetal material mixed with water and a composite abrasive material, said slurry having a viscosity less than the viscosity of the polyvinyl acetal material forming said device body, said composite abrasive material comprising particles of abrasive material mounted in carrier particles of polyvinyl acetal, said slurry being coated and cured on said outer surface of said cylindrical roller to form an abrasive skin.

19. A semiconductor polishing device as claimed in claim 18 wherein said abrasive material is selected from the group consisting of aluminum oxide, heat treated aluminum oxide, white fused aluminum oxide, black silicon carbide, green silicon carbide, silicon nitride, titanium diboride, boron carbide, tungsten carbide, titanium carbide, tantalum carbide, diamond, silica, silicon dioxide, iron oxide, chromia, ceria, cerium oxide, manganese dioxide, zirconia, titania, silicates, tin oxide, cubic boron nitride, garnet, alumina zirconia, zirconium oxide, sol gel abrasive particles, and combinations thereof.

20. A process of making a semiconductor polishing roller comprising of the steps of:
   a. molding a roller body of clean porous polyvinyl acetal sponge with over 80% of the pores of said porous polyvinyl acetal sponge ranging from about 7 microns to about 40 microns in diameter;
   b. applying a coating of a slurry comprising an adhesive and abrasive particles to the outer surface of said roller to form a skin; and
   c. curing said slurry skin to said roller body with ultra violet light forming a unitary roller device with a thin abrasive skin.

21. A process of making a semiconductor polishing roller as claimed in claim 20 wherein said curing takes place over a period ranging from 0.1 minutes to 5 minutes.

22. A process of making a semiconductor polishing roller as claimed in claim 20 wherein said curing takes place in about 1 minute at about 300 watts.

23. A process of making a semiconductor polishing roller as claimed in claim 20 wherein said coating applied is less than 0.2 mm in thickness.

24. A process of making a semiconductor polishing roller as claimed in claim 20 wherein said abrasive particles are selected from the group consisting of aluminum oxide, heat treated aluminum oxide, white fused aluminum oxide, black silicon carbide, green silicon carbide, silicon nitride, titanium diboride, boron carbide, tungsten carbide, titanium carbide, tantalum carbide, diamond, silica, silicon dioxide, iron oxide, chromia, ceria, cerium oxide, manganese dioxide, zirconia, titania, silicates, tin oxide, cubic boron nitride, garnet, alumina zirconia, zirconium oxide, sol gel abrasive particles and combinations thereof.

25. A process of making a semiconductor polishing roller as claimed in claim 20 wherein said adhesive is selected from the group consisting of formulated aliphatic polyether urethane methacrylate, aromatic difunctional polyether urethane methacrylate; formulated multifunctional aliphatic urethane acrylate and combinations thereof.

26. A polishing device as claimed in claim 1 wherein said polyvinyl acetal body has a durometer ranging from 5–9 depending upon wetness of the material.

27. A polishing device as claimed in claim 1 wherein said porous polyvinyl acetal body has a pore size ranging from about 7 microns to about 40 microns for at least 90% of the pores.

28. A polishing device as claimed in claim 1 wherein the weight of abrasive particles to the weight of urethane based adhesive ranges from about 30% to about 50%.

29. A polishing device as claimed in claim 1 wherein said urethane based adhesive is selected from the group consisting of formulated allphatic polyether urethane methacrylate, aromatic difunctional polyether urethane methacrylate; formulated multifunctional allphatic urethane acrylate and combinations thereof.

* * * * *